(12) United States Patent
Chinthakindi et al.

(10) Patent No.: US 7,022,246 B2
(45) Date of Patent: Apr. 4, 2006

(54) METHOD OF FABRICATION OF MIMCAP AND RESISTOR AT SAME LEVEL

(75) Inventors: Anil K. Chinthakindi, Poughkeepsie, NY (US); Shwu-Jen Jeng, Wappingers Falls, NY (US); Michael F. Lofaro, Milton, NY (US); Christopher M. Schnabel, Poughkeepsie, NY (US); Kenneth J. Stein, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/336,992

(22) Filed: Jan. 6, 2003

(65) Prior Publication Data
US 2004/0130434 A1 Jul. 8, 2004

(51) Int. Cl.
*H01L 21/302* (2006.01)

(52) U.S. Cl. .............................. 216/6; 216/13; 216/49; 216/88; 438/384; 438/393; 438/689; 438/692; 438/970; 29/610.1; 29/846

(58) Field of Classification Search .................... 216/6, 216/13, 16, 18, 38, 41, 88; 438/238, 239, 438/381–384, 687, 692, 737, 742
See application file for complete search history.

(56) References Cited

U.S. PATENT DOCUMENTS

| | | | | |
|---|---|---|---|---|
| 5,367,284 | A * | 11/1994 | Morris | 338/306 |
| 6,365,480 | B1 * | 4/2002 | Huppert et al. | 438/381 |
| 6,399,974 | B1 * | 6/2002 | Ohtsuki | 257/296 |
| 6,441,447 | B1 * | 8/2002 | Czagas et al. | 257/379 |
| 6,500,724 | B1 * | 12/2002 | Zurcher et al. | 438/384 |
| 6,730,573 | B1 * | 5/2004 | Ng et al. | 438/381 |
| 6,750,114 | B1 * | 6/2004 | Adler et al. | 438/396 |
| 6,762,108 | B1 * | 7/2004 | Gambino et al. | 438/396 |

* cited by examiner

*Primary Examiner*—Anita Alanko
(74) *Attorney, Agent, or Firm*—Scully, Scott, Murphy & Presser, P.C.; Jay H. Anderson, Esq.

(57) ABSTRACT

A method is disclosed of fabricating a MIMCAP (a capacitor (CAP) formed by successive layers of metal, insulator, metal (MIM)) and a thin film resistor at the same level. A method is also disclosed of fabricating a MIMCAP and a thin film resistor at the same level, and a novel integration scheme for BEOL (back-end-of-line processing) thin film resistors which positions them closer to FEOL (front-end-of-line processing) devices.

5 Claims, 9 Drawing Sheets

_US 7,022,246 B2_

METHOD OF FABRICATION OF MIMCAP AND RESISTOR AT SAME LEVEL

BACKGROUND OF THE INVENTION

1. Field of the Invention

The present invention relates generally to a method of fabricating a MIMCAP (a capacitor (CAP) formed by successive layers of metal, insulator, metal (MIM)) and a thin film resistor at the same level. The subject invention also pertains to a method of fabricating a MIMCAP and thin film resistor at same level, and a novel integration scheme for BEOL (back-end-of-line processing) thin film resistors which positions them closer to FEOL (front-end-of-line processing) devices.

2. Discussion of the Prior Art

In the prior art, thin film resistors are currently incorporated in the BEOL (back-end-of-line processing) levels, typically between the MX (M1/MT) metal levels or at the thick interconnect level, wherein MX designates any metal layer. Because the thin film resistors are so far away from the transistor devices, the wiring is often quite complicated and lengthy, adding to the interconnect delay of typical circuits of any type such as amplifier circuits and oscillator circuits. Because of these concerns and problems, it is desirable to position the thin film resistors closer to the FEOL (front-end-of-line processing) devices, which are generally basic building block circuits.

The wiring path for a prior art thin film resistor using the current prior) art integration scheme is CA (contact metal)-->M1 (metal layer 1)--->V1 (via)--->MT (metal layer 2,3, etc.)--->V1 (via)--->K1 (thin film resistor) and back in the reverse order to CA.

SUMMARY OF THE INVENTION

Accordingly, it is a primary object of the present invention to provide a method of fabricating a MIMCAP and thin film resistor at the same level, and also to provide a novel integration scheme for BEOL (back-end-of-line processing) thin film resistors which positions them closer to the FEOL (front-end-of-line processing) devices.

The present invention provides a single level integration process for the fabrication of a MIMCAP and a thin film TaN (tantalum nitride) resistor which allows both a BEOL (back-end-of-line) capacitor and a thin film TaN resistor to be fabricated at the same level. The integration process allows the two devices to be wired at the lowest metal level (M1), which had previously not been possible with prior art BEOL passive circuits. Circuit designers can now wire to the TaN thin film resistor at the lowest metal level, which reduces parasitics and allows more efficient usage of the existing wiring levels. The present invention reduces the design complexity and enhances the performance of the resultant circuits.

The number of processing steps is reduced using this fabrication process. The integration challenges in the prior art process (e.g. vias landing on the resistor and the capacitor) are eliminated. The process sequence of the present invention reduces cost, enhances performance and improves usability of the resultant circuits.

The wiring path to the thin film TaN resistor is reduced and simplified using the fabrication process sequence, which reduces the interconnect delay and coupling capacitance in the circuit, improving the circuit performance for both digital and analog applications. The integration scheme places the thin film resistor on top of the CA (contact metal) level, and the thin film resistor is interconnected through the M1 level which provides a shorter interconnect path than current prior art integration schemes.

The thermal resistance of the thin film resistor is lower than the thermal resistance of a prior art resistor produced by current prior art processes because of the proximity of the circuit elements to the substrate and the intimate contact thereof with metal lines, rather than by contact through vias as in the prior art. The low thermal resistance reduces the temperature coefficient of the thin film resistor, allowing circuit designers to possibly use a BEOL resistor as a precision resistor device, which has not been possible with current prior art processes.

The thermal resistance of the thin film resistor is improved due to the better heat dissipation through the silicon substrate, as the thin film resistor is closer to the silicon substrate which functions as a heat sink. Because of the proximity of the TaN resistor to the bulk silicon substrate, the thermal resistance (Rth) of the TaN resistor is 16–23% (15–21%?) less than a TaN resistor on BPSA implemented in the current prior art 8HP module, and is 60–70% less than the TaN resistor on STI implemented in the current prior art 8HP module. A temperature rise of a thin film resistor may adversely impact upon the reliability of the circuit and has been a concern. The reduction of thermal resistance and temperature rise of the thin film resistor produced by the process of the present invention improves the reliability of the circuit.

The wiring path to the thin film resistor is shortened using the process of the present invention, which reduces the interconnect delay and coupling capacitance in the circuit to improve circuit performance. The wiring path for a thin film resistor using the current prior art integration scheme CA-->M1--->V1--->M1-->V1-->K1 and back in the reverse order to CA. In contrast thereto, the wiring path for a thin film resistor using the process of the present invention is a serial connection comprising CA--->M1-->K1 and back in the reverse order to CA.

BRIEF DESCRIPTION OF THE DRAWINGS

The foregoing objects and advantages of the present invention for a method of fabrication of a MIMCAP and a thin film resistor at same level may be more readily understood by one skilled in the art with reference being had to the following detailed description of several embodiments thereof, taken in conjunction with the accompanying drawings wherein like elements are designated by identical reference numerals throughout the several views, and in which:

FIG. 1 illustrates the structure after steps of depositing a 300A layer of oxide insulation, then depositing a layer of metal on top of the layer of oxide insulation to form the bottom electrode of the capacitor, then depositing a layer of dielectric on top of the layer of metal to form the dielectric of the capacitor.

FIG. 2 illustrates the structure after steps of lithographic patterning and etching the dielectric and bottom electrode of the capacitor.

FIG. 3 illustrates the structure after steps of depositing a layer of metal to form the top electrode of the capacitor on top of the capacitor dielectric and also to form the thin film resistor in a separate structure to one side of the capacitor, and then depositing a nitride cap over the metal layer of the capacitor top electrode and the thin film resistor.

FIG. 4 illustrates the structure after steps of lithographic patterning and etching the top electrode of the capacitor and the thin film resistor.

FIG. 5 illustrates the structure after a step of depositing a thick layer of inter layer dielectric ILD over the top electrode of the capacitor and the thin film resistor.

FIG. 6 illustrates the structure after steps of lithographic patterning and etching the ILD line level.

FIG. 7 illustrates the structure after steps of depositing a layer of liner and a thick plated copper layer.

FIG. 8 illustrates the structure after steps of chemical mechanical polishing CMP to finish the copper to an endpoint thickness and to remove the liner.

FIGS. 9 and 10 are respectively a side view and a top plan view of the final structure of the MIMCAP.

FIG. 10 illustrates a current prior art integration scheme for defining a K1 thin film resistor wherein the K1 thin film resistor contacts an M1 metal pattern through a via V0.

FIG. 11 illustrates a structure similar to the structure at the bottom of FIG. 10 and shows a first step of the first subtractive process of the present invention wherein a layer of TaN (tantalum nitride) is deposited on top of the BPSG substrate, with the contacts CB, CE, CC and other circuit components such as the transistor T already formed therein.

FIG. 12 illustrates the structure after a second step wherein a K1 mask has been used to etch the TaN layer, leaving a K1 thin film resistor on the top of the left side of the structure.

FIG. 13 illustrates the structure after a third step wherein a layer of SiNi (nitride) is first deposited over the structure of FIG. 12, followed by depositing a thick layer of M1 ILD (inter layer dielectric) of SiO2 thereover.

FIG. 14 illustrates the structure after a fourth step wherein the M1 ILD and SiNi have been lithographically patterned with an M1 mask and then etched with an oxide etch/nitride etch.

FIG. 15 illustrates the structure after a fifth step wherein the etched areas of FIG. 14 have been filled with M1 metal to form the completed product of the K1/M1 process.

FIG. 16 illustrates a structure similar to the structure at the bottom of FIG. 10 having a BPSG substrate, and illustrates the structure after a first step of depositing a layer of TaN on top of 300A oxide.

FIG. 17 illustrates the structure after a second step of etching the TaN using a K1 mask, leaving a K1 thin film resistor on the left side of the structure.

FIG. 18 illustrates the structure after a third step of depositing nitride, followed by depositing a thick layer of M1 ILD (inter layer dielectric) of SiO2 thereover.

FIG. 19 illustrates the structure after a fourth step of M1 lithography, followed by M1 etching (oxide etch, stop on nitride, followed by nitride etch).

FIG. 20 illustrates the structure after a fifth step of wet etching of 300A of the oxide layer to open the contacts/vias CB, CE, CC.

FIG. 21 illustrates the structure after the complete M1 copper damascene process in which the etched areas are first filled with metal and then the surface is planarized by CMP (chemical mechanical polishing).

FIG. 22 illustrates a structure similar to the structure at the bottom of FIG. 10, and illustrates the structure after a first step of a K1/M1 copper damascene process wherein the BPSG is etched using a K1 mask to form a trench TR for the K1 thin film resistor.

FIG. 23 illustrates the structure after a second step of the K1/M1 copper damascene process which deposits a TaN thin film.

FIG. 24 illustrates the structure after a third step of polishing the TaN to form a K1 resistor in the trench.

FIG. 25 illustrates the structure after depositing nitride/M1 oxide, M1 litho, M1 oxide nitride RIE, M1 copper damascene.

DETAILED DESCRIPTION OF THE INVENTION

FIGS. 1–10 illustrate the sequential steps of a method for fabricating a MIMCAP (a capacitor (CAP) formed by successive layers of metal, insulator, metal (MIM)) and a thin film resistor at the same level.

Figure 1:
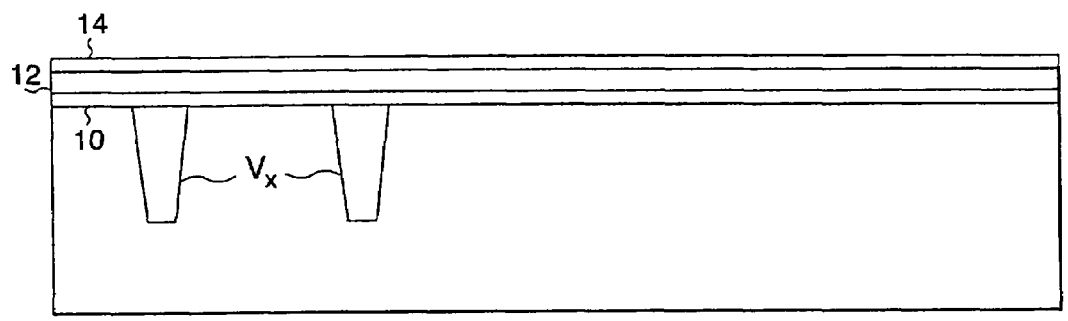
FIGS. 1–10 illustrate the sequential steps of a method for fabricating a MIMCAP (a capacitor (CAP) formed by successive layers of metal, insulator, metal (MIM)) and a thin film resistor at the same level.

FIG. 1 illustrates the structure, which could be at any via level and preferably at the lowest metal level (M1), after steps of depositing a 300A layer 10 of oxide insulation, then depositing a layer of metal 12 such as TaN on top of the layer of oxide insulation to form the bottom electrode of the capacitor, then depositing a layer of dielectric 14 such as tantalum pentoxide, silicon nitride or silicon dioxide on top of the layer of metal to form the dielectric of the capacitor. Vias Vx are also shown as being representative of a typical circuit.

Figure 2:
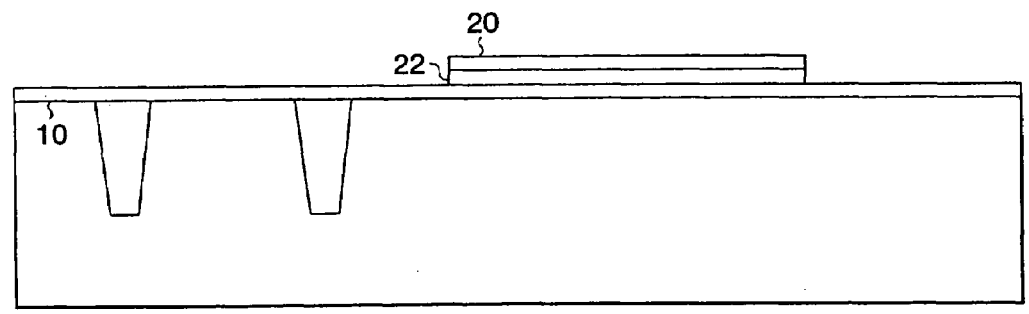

FIG. 2 illustrates the structure after steps of lithographic patterning and etching the dielectric 20 and the bottom electrode 22 of the capacitor.

Figure 3:
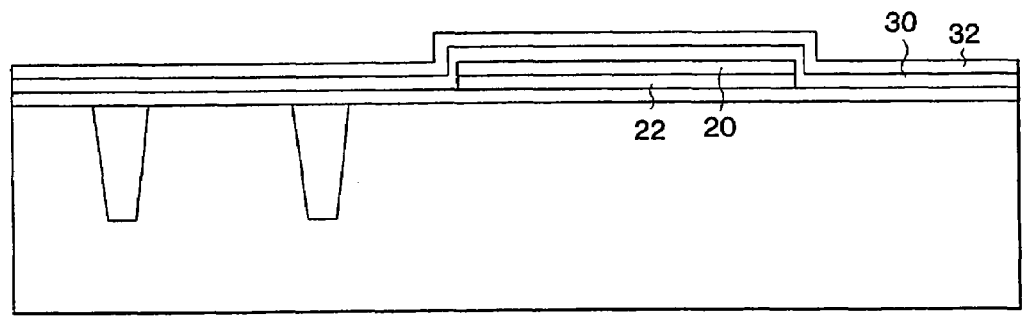

FIG. 3 illustrates the structure after steps of depositing a layer of metal (preferably TaN) 30 to form the top electrode of the capacitor on top of the capacitor dielectric and also to form the thin film resistor in a separate structure to one side of the capacitor, and then depositing a nitride etch stop cap 32 over the metal layer of the capacitor top electrode and the thin film resistor.

Figure 4:
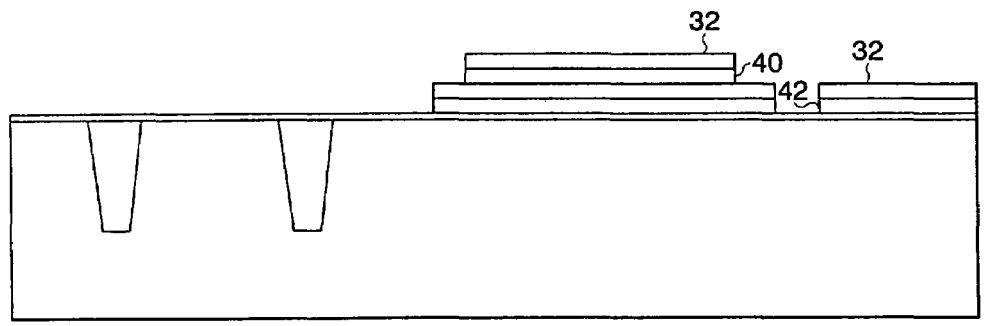

FIG. 4 illustrates the structure after steps of lithographic patterning and etching the metal layer 30 and the nitride cap 32 to form the top electrode 40 of the capacitor and the thin film resistor 42, each having a nitride cap layer 32 thereover.

Figure 5:
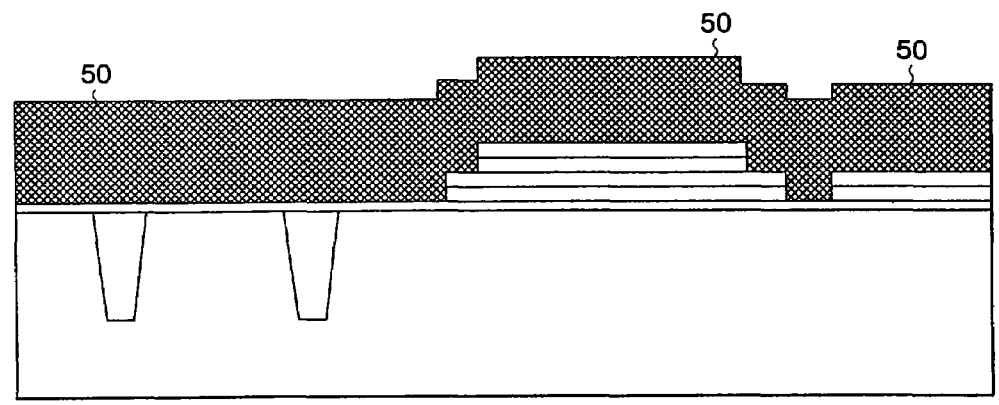

FIG. 5 illustrates the structure after a step of depositing a thick layer of inter layer dielectric ILD 50 over the top electrode of the capacitor and the thin film resistor. The ILD can optionally be polished to planarize the topography at this step.

Figure 6:
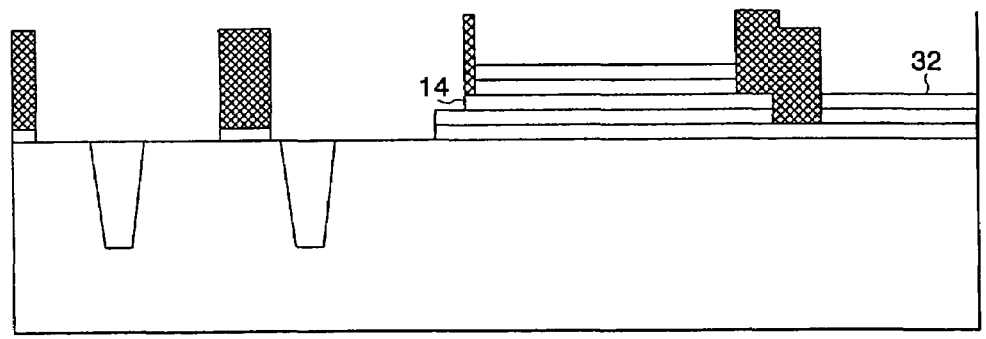

FIG. 6 illustrates the structure after steps of lithographic patterning and etching the ILD line (conductor) level, which also opens the nitride layer 14 over the bottom electrode of the capacitor.

Figure 7:
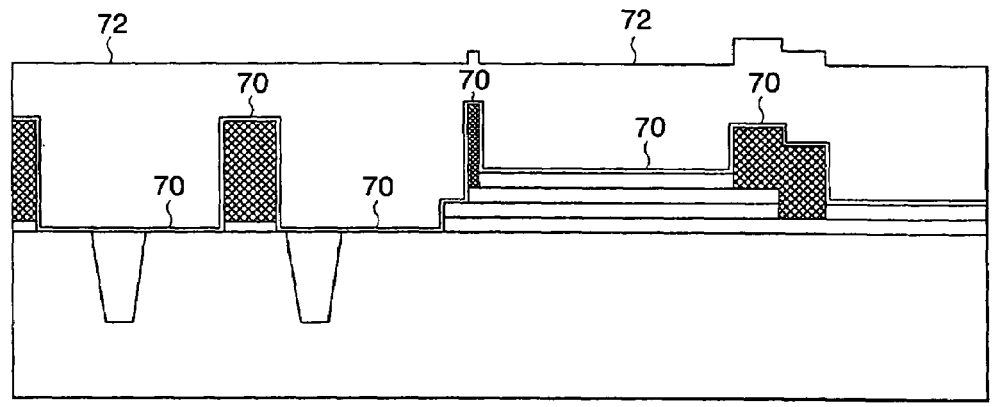

FIG. 7 illustrates the structure after steps of depositing a layer of liner 70 of a barrier material such as tantalum nitride to prevent the copper from directly contacting silicon, a layer of seed copper which is a thin film of copper sputtered on the liner 70 to enable a thick layer of copper 72 to be plated thereover.

Figure 8:
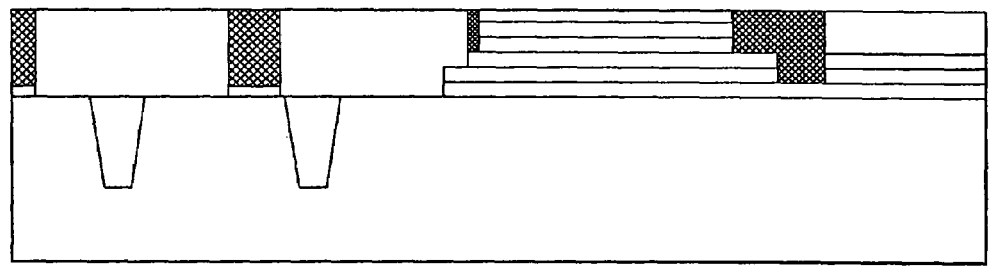

FIG. 8 illustrates the structure after steps of chemical mechanical polishing CMP to finish the copper to an endpoint thickness and to remove the liner, such that the liner and copper residuals are removed during a polish step, which is followed by a buff step to smooth the copper surface to remove any scratches and reduce defects.

Figure 9:
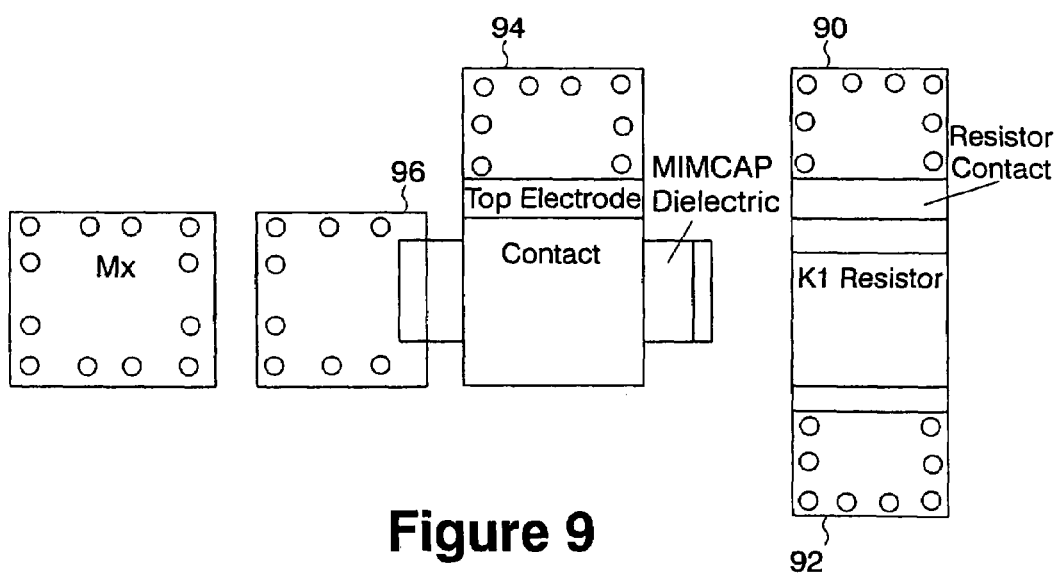

FIG. 9 is a top plan view of the final structure of the MIMCAP, and illustrates resistor contacts 90, 92 on opposite sides of the thin film K1 resistor, and contacts 94, 96 to the top and bottom electrodes of the capacitor. The circles in the contacts are symbolic of vias extending to other layers of the structure.

Figure 10:
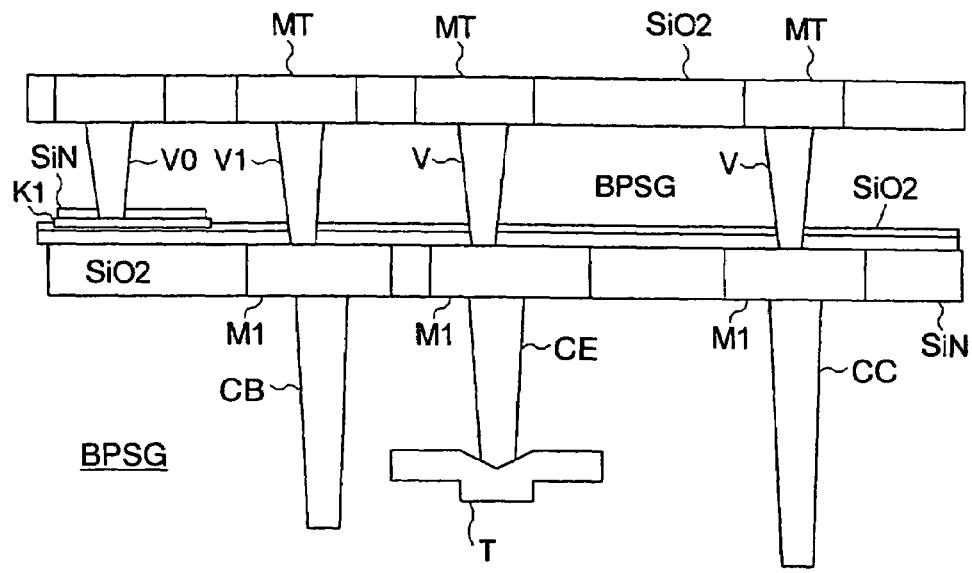

FIG. 10 illustrates a current prior art integration scheme for defining a K1 thin film resistor wherein the K1 thin film resistor contacts an MT metal pattern through a via V0. FIG. 10 is a schematic illustration of a typical circuit having a substrate of boron phosphor doped silicate glass (BPSG) having a plurality of contacts (vias?) CB, CE, CC extending through the BPSG substrate, wherein the contact CE extends to a schematic representation of a transistor T which can be any type of transistor such as an FET or a bipolar transistor. The layer above the BPSG substrate is a first thick layer of insulation SiO2 having a first M1 metal pattern therein, with each of the contacts contacting a different portion of the M1 metal pattern, over which a nitride layer of SiNi is deposited, over which a thin insulation layer of SiO2 is deposited. A thin film resistor K1 of TaNi is formed on the left side of FIG. 10 over the SiO2 insulation layer. A SiNi etch stop layer is formed over the thin film resistor K1. A second thick layer of insulation SiO2 having a second MT metal pattern therein is formed near the top of the structure, wherein different areas of the MT metal pattern have vias V, V0, V1 extending downwardly through a layer of BPSG, wherein the via V0 on the left extends downwardly and contacts the thin film resistor K1 through the etch stop layer of SiNi (such that the metal pattern contacts the thin film resistor K1 through the via V0), and the other three vias extend downwardly to contact different portions of the metal layer M1 which are contacted from below by the several contacts CB, CE, CC.

Pursuant to the present invention, the K1 TaN thin film resistor can be defined by either a subtractive process or a damascene process. Generally, in a subtractive process, a layer of metal is applied on a structure, a mask is then used to form a pattern on the metal layer to be preserved, after which the areas between the pattern are etched and removed, leaving the patterned metal layer. Generally, in a damascene process, a mask is used to form a pattern of trenches and holes in a structure, after which a layer of metal is applied on the structure, filling the trenches and holes, after which the surface is polished leaving only the metal in the filled trenches and holes to form a patterned metal layer.

FIGS. 11–15 illustrate a K1/M1 first subtractive process 1 of the present invention for defining a K1 thin film resistor wherein the K1 thin film resistor is in direct contact with the M1 metal pattern rather than through a via as shown in the prior art of FIG. 10.

Figure 11:
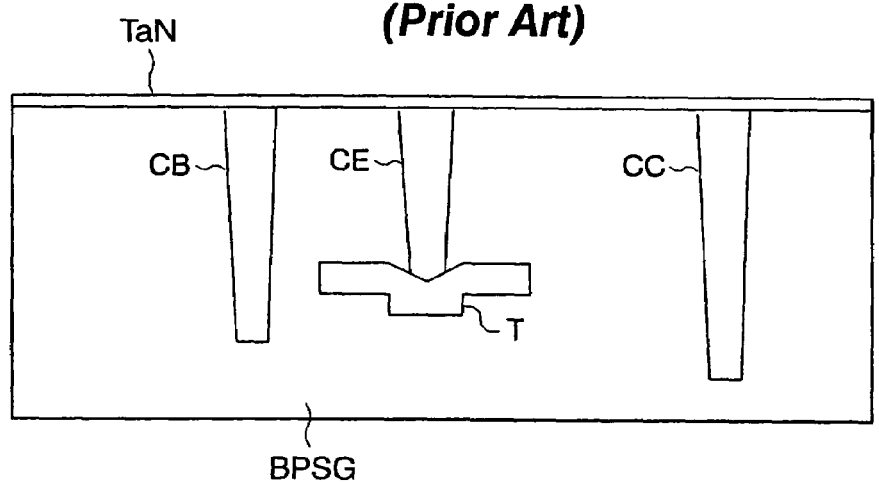
FIGS. 11–15 illustrate a K1/M1 first subtractive process 1 of the present invention for defining a K1 thin film resistor wherein the K1 thin film resistor is in direct contact with the M1 metal pattern rather than through a via as shown in the prior art of FIG. 10.

FIG. 11 illustrates a structure similar to the structure at the bottom of FIG. 10 having a BPSG substrate, contacts CB, CE, CC, and a transistor T, and shows a first step of the first subtractive process of the present invention wherein a layer of TaN (tantalum nitride) is deposited on top of the BPSG substrate, with the contacts CB, CE, CC and other circuit components such as the transistor T already formed therein.

Figure 12:
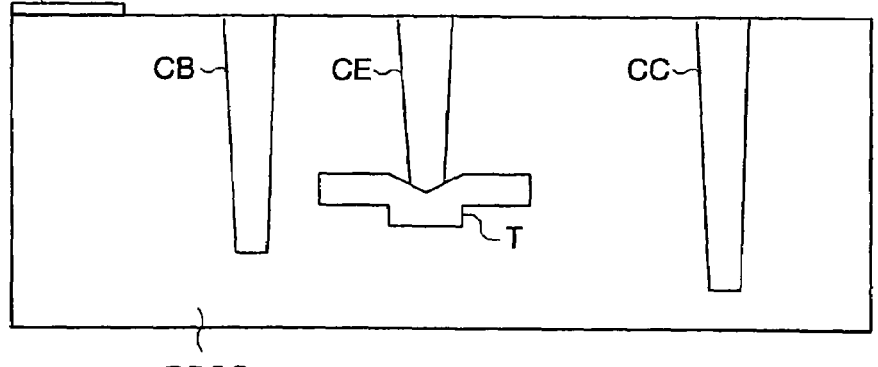

FIG. 12 illustrates the structure after a second step wherein a K1 mask has been used to etch the TaN layer, leaving a K1 thin film resistor on the top of the left side of the structure.

Figure 13:
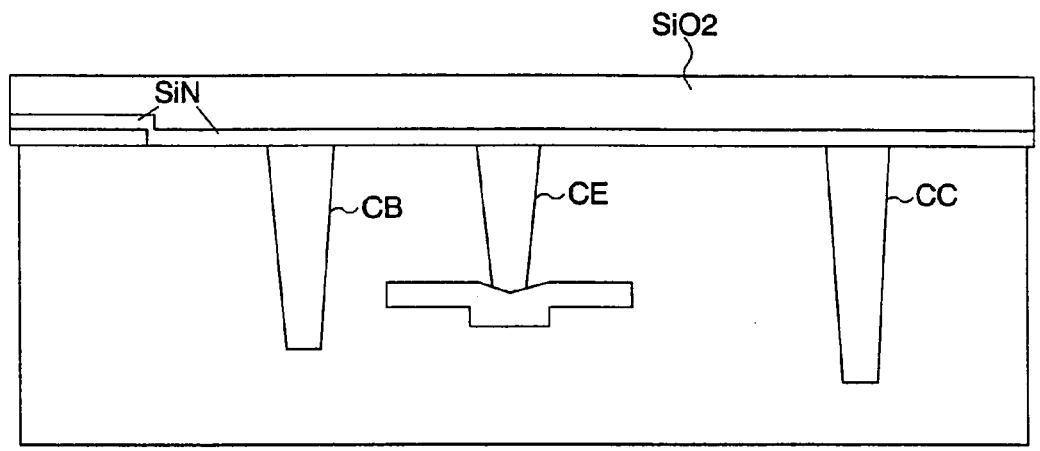

FIG. 13 illustrates the structure after a third step wherein a layer of SiNi (nitride) is first deposited over the structure of FIG. 12, followed by depositing a thick layer of M1 ILD (inter layer dielectric) of SiO2 thereover.

Figure 14:
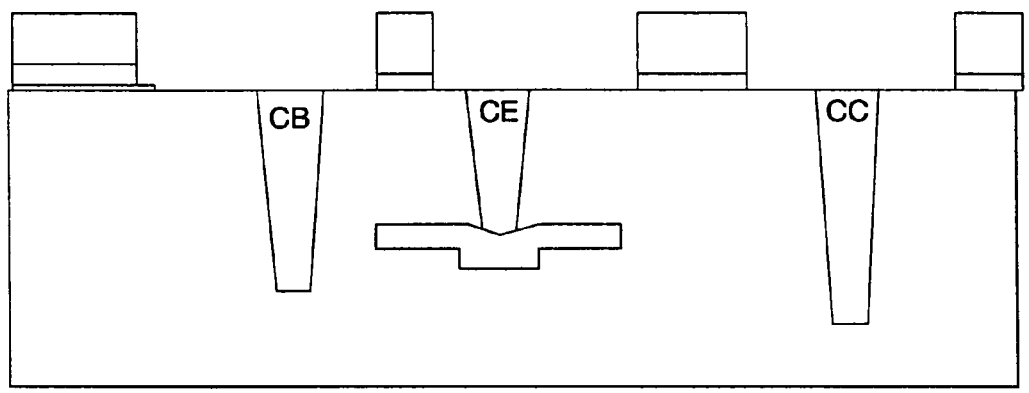

FIG. 14 illustrates the structure after a fourth step wherein the M1 ILD and SiNi have been lithographically patterned with an M1 mask and then etched with an oxide etch/nitride etch.

Figure 15:
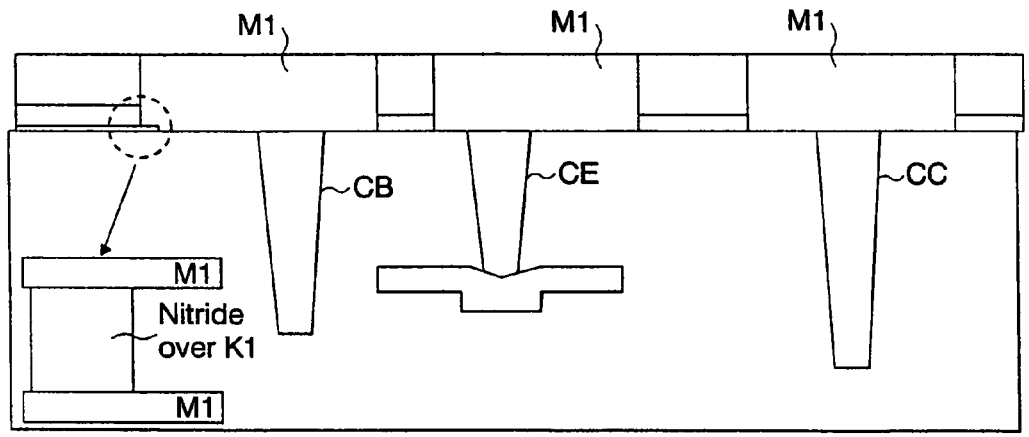

FIG. 15 illustrates the structure after a fifth step wherein the etched areas of FIG. 14 have been filled with M1 metal to form the completed product of the K1/M1 process, such that the M1 metal contacts the thin film resistor K1 directly instead of through a via as in the prior art. The structure in the bottom left portion of FIG. 15 illustrates an enlarged view of the structure in the oval, and is a top plan view, rotated by 90 degrees. The top of the enlarged view shows the M1 metal contacting one end of the nitride over K1, to form a first direct contact to the thin film resistor K1, and the bottom of the enlarged view shows the M1 metal contacting the second end of the nitride over K1, to form a second direct contact to the thin film resistor K1.

FIGS. 16–21 illustrate a K1/M1 second subtractive process 2 for defining a K1 resistor.

Figure 16:
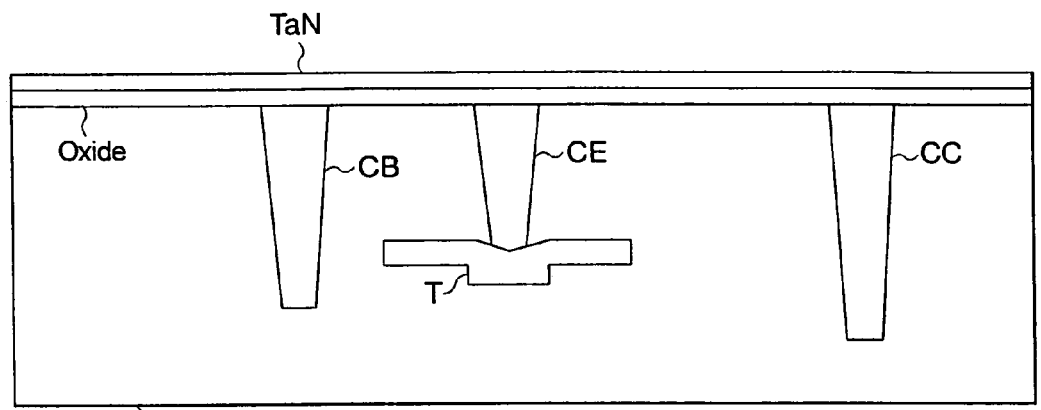
FIGS. 16–21 illustrate a K1/M1 second subtractive process 2 for defining a K1 resistor.

FIG. 16 illustrates a structure similar to the structure at the bottom of FIG. 10 having a BPSG substrate, contacts CB, CE, CC, and a transistor T, and illustrates the structure after a first step of depositing a layer of TaN on top of 300A oxide.

Figure 17:
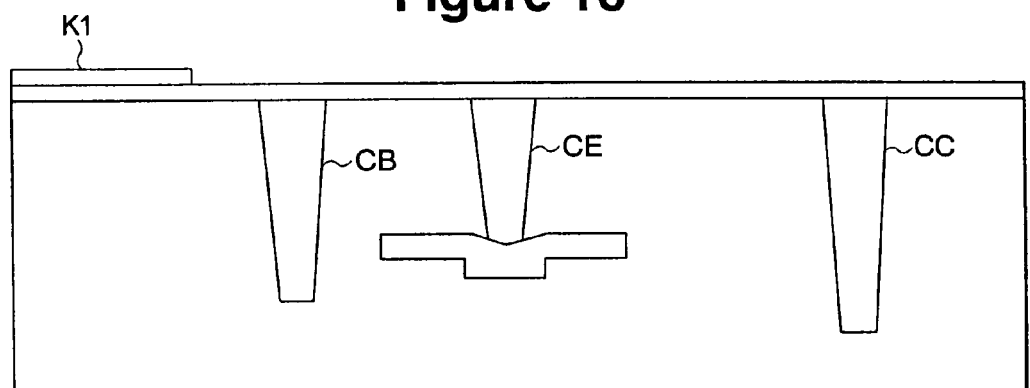

FIG. 17 illustrates the structure after a second step of etching the TaN using a K1 mask, leaving a K1 thin film resistor on the left side of the structure.

Figure 18:
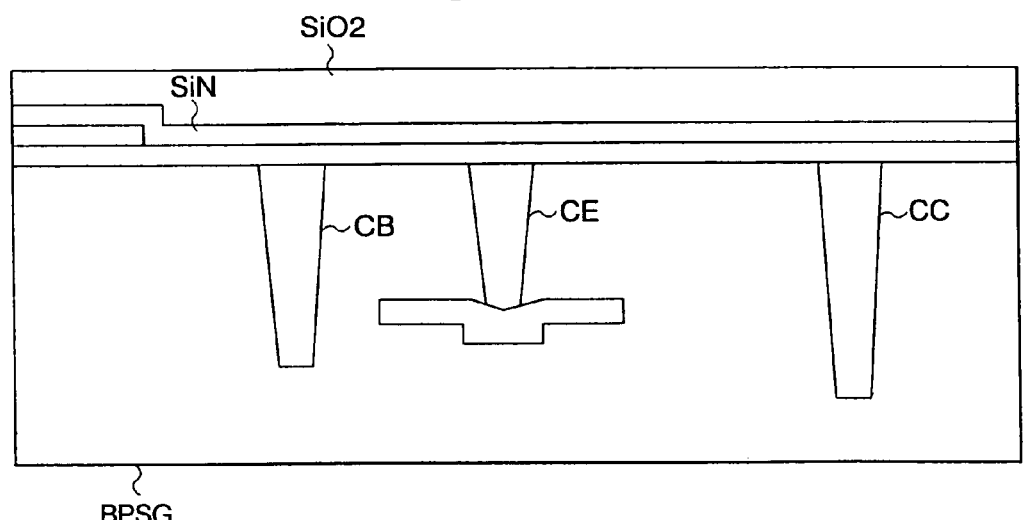

FIG. 18 illustrates the structure after a third step of depositing nitride, followed by depositing a thick layer of M1 ILD (inter layer dielectric) of SiO2 thereover.

Figure 19:
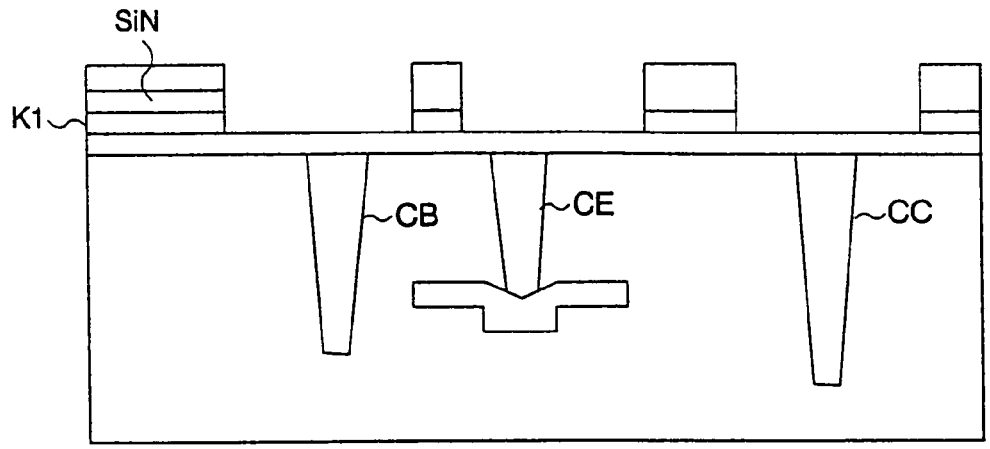

FIG. 19 illustrates the structure after a fourth step of M1 lithography, followed by M1 etching ((oxide etch, stop on nitride)/nitride etch?).

Figure 20:
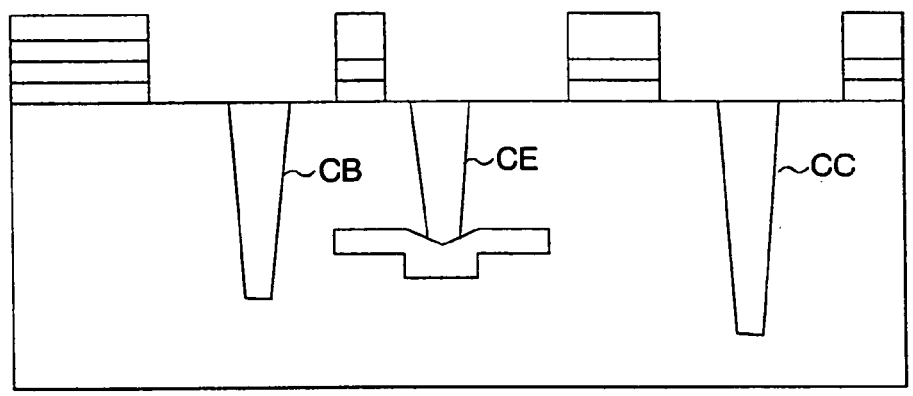

FIG. 20 illustrates the structure after a fifth step of wet etching of 300A of the oxide layer to open the contacts/vias CB, CE, CC.

Figure 21:
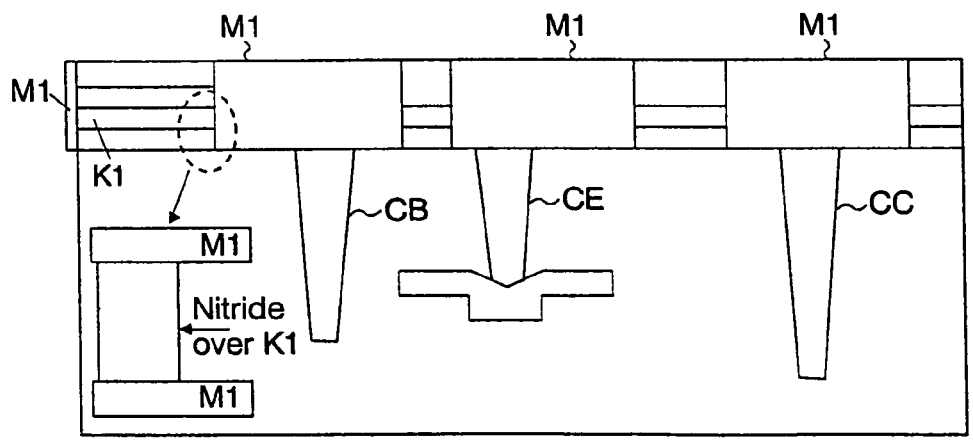

FIG. 21 illustrates the structure after the complete M1 copper damascene process in which the etched areas are first filled with metal and then the surface is planarized by CMP (chemical mechanical polishing). The structure in the bottom left portion of FIG. 21 illustrates an enlarged view of the structure in the oval, and is a top plan view, rotated by 90 degrees. The top of the enlarged view shows the M1 metal contacting one end of the nitride over K1, to form a first direct contact to the thin film resistor K1, and the bottom of the enlarged view shows the M1 metal contacting the second end of the nitride over K1, to form a second direct contact to the thin film resistor K1.

FIGS. 22–25 illustrate the steps of a third K1/M1 copper damascene process for defining a K1 thin film resistor.

Figure 22:
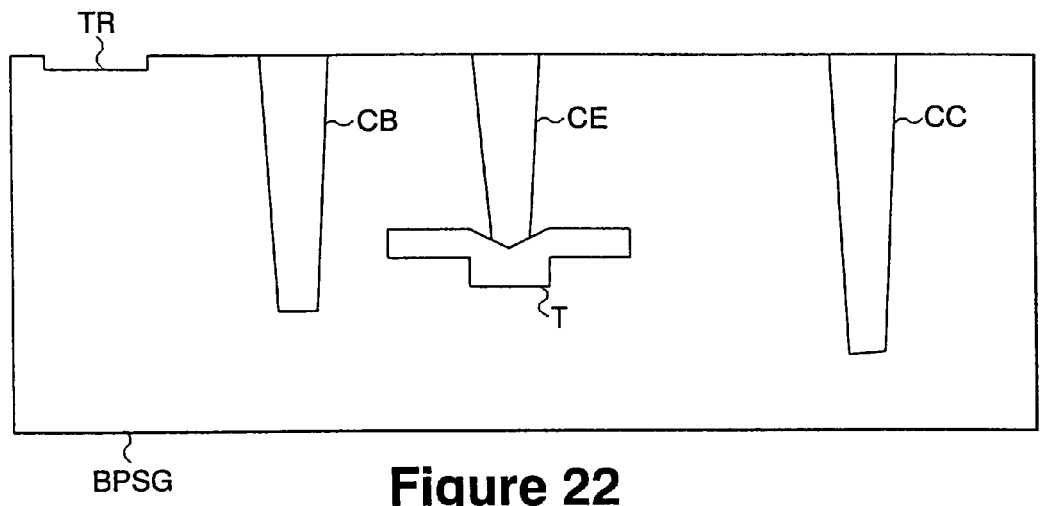
FIGS. 22–25 illustrate the steps of a third K1/M1 copper damascene process for defining a K1 thin film resistor.

FIG. 22 illustrates a structure similar to the structure at the bottom of FIG. 10 having a BPSG substrate, contacts CB, CE, CC, and illustrates the structure after a first step of a K1/M1 copper damascene process wherein the BPSG is etched using a K1 mask to form a trench TR for the K1 thin film resistor.

Figure 23:
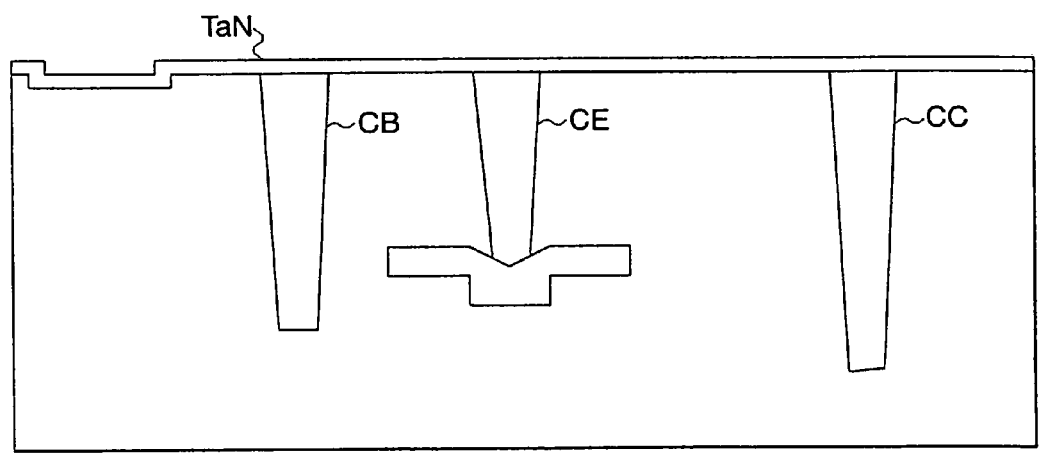

FIG. 23 illustrates the structure after a second step of the K1/M1 copper damascene process which deposits a TaN thin film.

Figure 24:
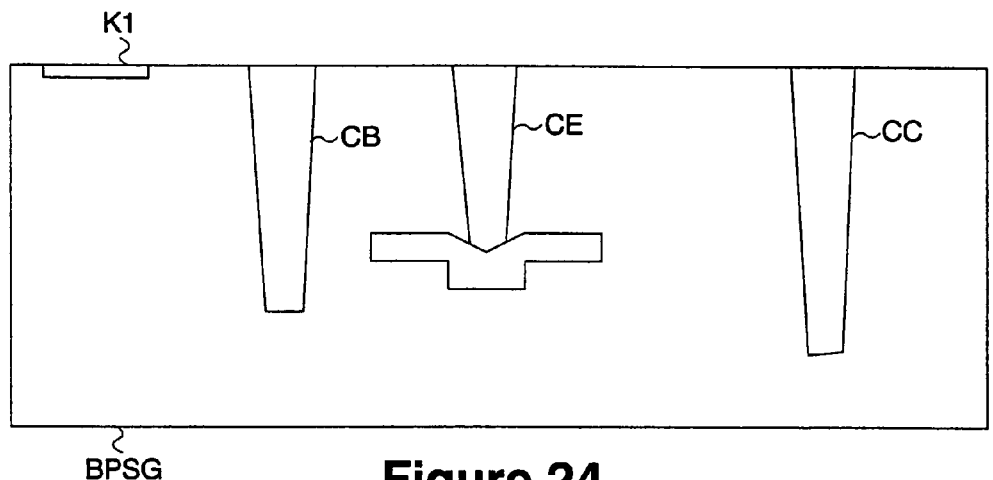

FIG. 24 illustrates the structure after a third step of polishing the TaN to form a K1 resistor in the trench.

Figure 25:
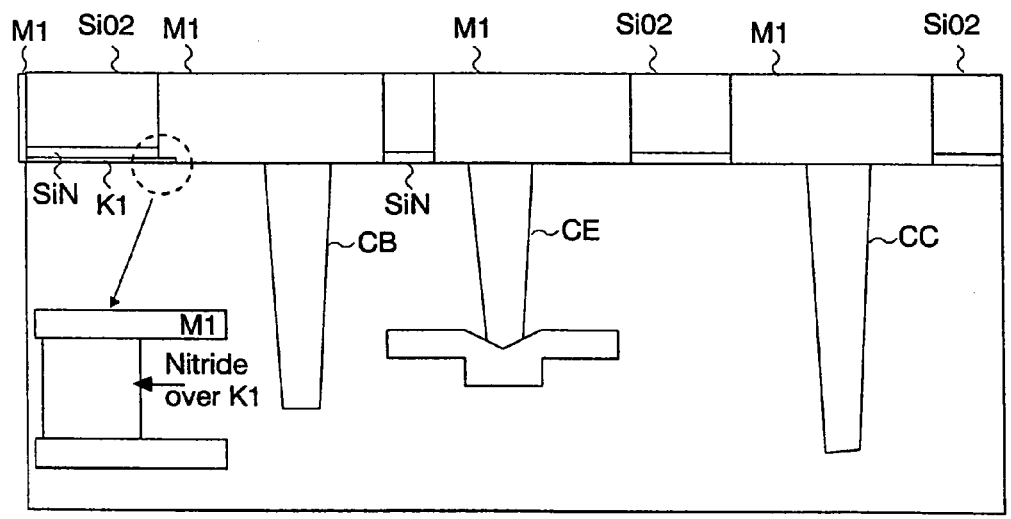

FIG. 25 illustrates the structure after depositing nitride/ M1 oxide, M1 litho, M1 oxide nitride RIE, M1 copper damascene. The structure in the bottom left portion of FIG. 25 illustrates an enlarged view of the structure in the oval, and is a top plan view, rotated by 90 degrees. The top of the enlarged view shows the M1 metal contacting one end of the nitride over K1, to form a first direct contact to the thin film resistor K1, and the bottom of the enlarged view shows the M1 metal contacting the second end of the nitride over K1, to form a second direct contact to the thin film resistor K1.

The positive and negative aspects of the first and second disclosed approaches are as follows.

The resistor damascene approach provides good planarity but the resistor thickness uniformity is questionable (CMP/dishing/puddles).

In the second K1/M1 approach of FIGS. 16–20, the topography is more the result of an additional oxide film, and the M1/CA contact is determined by the wet etch of the 300A oxide film.

Both of the first and second K1/M1 approaches need nitride on top of K1 for an etch stop.

While several embodiments and variations of the present invention for a method of fabrication of MIMCAP and resistor at same level are described in detail herein, it should be apparent that the disclosure and teachings of the present invention will suggest many alternative designs to those skilled in the art.

The invention claimed is:

1. A method for fabricating a MIMCAP (capacitor formal by successive layers of metal, insulator, metal) and a thin film resistor at the same level of an integrated multi-layer circuit, comprising:
   deposit a layer of oxide insulation, then deposit a layer of metal on top of the layer of oxide insulation to form a bottom electrode of the capacitor, then deposit a layer of dielectric on top of the layer of metal to form a dielectric of the capacitor;
   lithographic pattern and etch the dielectric and bottom electrode of the capacitor;
   deposit a layer of metal to form the top electrode of the capacitor on top of the capacitor dielectric and also to form the thin film resistor in a separate structure to one side of the capacitor, and deposit a nitride etch stop cap over the metal layer of the capacitor top electrode and the thin film resistor;
   lithographic pattern and etch the top electrode of the capacitor and the thin film resistor;
   deposit a layer of inter layer dielectric ILD over the top electrode of the capacitor and the thin film resistor,
   lithographic pattern and etch the ILD line level;
   deposit a layer of liner and a copper layer to form an integrated copper structure; chemical mechanical polish the integrated copper structure to form the final structure of the MIMCAP,
   wherein said final structure comprises an electrical wiring path to the MIMCAP and the thin film resistor through multiple metal layer lines, which comprise at least a first metal layer line that directly contacts the top electrode of the MIMCAP, a second metal layer line that directly contacts the bottom electrode of the MIMCAP, a third metal layer line that directly contacts one side of the thin film resistor, and a fourth metal layer line that directly contacts the other opposite side of the thin film resistor, and wherein said first, second, third, and fourth metal layer lines are located at the same metal level.

2. The method of claim 1, including fabricating the structure at a lowest metal level of the integrated multi-layer circuit close to a substrate which functions as a heat sink.

3. The method of claim 1, wherein the step of depositing a layer of metal to form the top electrode of the capacitor and also to form the thin film resistor deposits a metal layer of TaN.

4. The method of claim 1, including fabricating the thin film resistor on top of the contact metal level, and interconnecting the thin film resistor through the third and fourth metal layer lines at a lowest metal level to provide a short interconnect path.

5. The method of claim 1, wherein the electrical wiring path to thin film resistor extends serially through contact metal the third metal layer line at one side of the thin film resistor to the thin film resistor and back through the fourth metal layer line at the same metal level at an opposite side of the thin film resistor to the contact metal.

* * * * *